(12) United States Patent
Zabroda

(10) Patent No.: US 11,025,265 B2
(45) Date of Patent: Jun. 1, 2021

(54) METHOD AND SYSTEM FOR AN ASYNCHRONOUS SUCCESSIVE APPROXIMATION REGISTER ANALOG-TO-DIGITAL CONVERTER WITH WORD COMPLETION FUNCTION

(71) Applicant: Luxtera LLC, Wilmington, DE (US)

(72) Inventor: Oleksiy Zabroda, Constable, NY (US)

(73) Assignee: Luxtera LLC, Wilmington, DE (US)

( * ) Notice: Subject to any disclaimer, the term of this patent is extended or adjusted under 35 U.S.C. 154(b) by 0 days.

(21) Appl. No.: 16/738,880

(22) Filed: Jan. 9, 2020

(65) Prior Publication Data

US 2020/0220553 A1 Jul. 9, 2020

Related U.S. Application Data

(60) Provisional application No. 62/790,283, filed on Jan. 9, 2019.

(51) Int. Cl.
| | |
|---|---|
| *H03M 1/12* | (2006.01) |
| *H03M 1/46* | (2006.01) |
| *G02F 1/01* | (2006.01) |
| *H03M 1/10* | (2006.01) |
| *H03K 5/24* | (2006.01) |

(52) U.S. Cl.
CPC .......... *H03M 1/125* (2013.01); *G02F 1/0123* (2013.01); *H03K 5/24* (2013.01); *H03M 1/1071* (2013.01); *H03M 1/462* (2013.01); *H03M 1/466* (2013.01)

(58) Field of Classification Search
CPC .... H03M 1/125; H03M 1/1071; H03M 1/462; G02F 1/0123
USPC ................................ 341/161, 155, 144, 172
See application file for complete search history.

(56) References Cited

U.S. PATENT DOCUMENTS 9,806,734 B1 * 10/2017 Madan ................ H03M 1/0624
2011/0241912 A1 * 10/2011 Doris .................. H03M 1/0614
341/110

* cited by examiner

*Primary Examiner* — Peguy Jean Pierre
(74) *Attorney, Agent, or Firm* — Patterson + Sheridan, LLP

(57) ABSTRACT

Methods and systems for an asynchronous successive approximation register analog-to-digital converter with word completion may include a successive approximation register (SAR) analog-to-digital converter (ADC) including a switched capacitor digital-to-analog converter (DAC), a word completion block, a comparator, and a metastability detector. The SAR ADC may sample a received analog electrical signal using the DAC, and convert the electrical signal to an n-bit digital signal by evaluating bits from a most significant bit to a least significant bit using the comparator. If the metastability detector determines that a time to evaluate one of the bits is longer than a threshold time, the metastability detector generates a metastability flag for each such bit. The converting may be initiated using a conversion enable clock pulse generated in the first SAR ADC. The metastability flag may be generated when a conversion enable pulse overlaps with a sampling clock pulse.

26 Claims, 13 Drawing Sheets

METHOD AND SYSTEM FOR AN ASYNCHRONOUS SUCCESSIVE APPROXIMATION REGISTER ANALOG-TO-DIGITAL CONVERTER WITH WORD COMPLETION FUNCTION

CROSS-REFERENCE TO RELATED APPLICATIONS/INCORPORATION BY REFERENCE

This application claims priority to and the benefit of U.S. Provisional Application No. 62/790,283 filed on Jan. 9, 2019, which is hereby incorporated herein by reference in its entirety.

FIELD

Aspects of the present disclosure relate to electronic components. More specifically, certain implementations of the present disclosure relate to methods and systems for an asynchronous successive approximation register analog-to-digital converter with word completion function.

BACKGROUND

Conventional approaches for analog-to-digital conversion may be costly, cumbersome, and/or inefficient—e.g., they may be complex and/or time consuming, and/or may reduce yields.

Further limitations and disadvantages of conventional and traditional approaches will become apparent to one of skill in the art, through comparison of such systems with some aspects of the present disclosure as set forth in the remainder of the present application with reference to the drawings.

BRIEF SUMMARY

System and methods are provided for an asynchronous successive approximation register analog-to-digital converter with word completion function, substantially as shown in and/or described in connection with at least one of the figures, as set forth more completely in the claims.

These and other advantages, aspects and novel features of the present disclosure, as well as details of an illustrated embodiment thereof, will be more fully understood from the following description and drawings.

DETAILED DESCRIPTION

As utilized herein the terms "circuits" and "circuitry" refer to physical electronic components (i.e. hardware) and any software and/or firmware ("code") which may configure the hardware, be executed by the hardware, and or otherwise be associated with the hardware. As used herein, for example, a particular processor and memory may comprise a first "circuit" when executing a first one or more lines of code and may comprise a second "circuit" when executing a second one or more lines of code. As utilized herein, "and/or" means any one or more of the items in the list joined by "and/or". As an example, "x and/or y" means any element of the three-element set $\{(x), (y), (x, y)\}$. In other words, "x and/or y" means "one or both of x and y". As another example, "x, y, and/or z" means any element of the seven-element set $\{(x), (y), (z), (x, y), (x, z), (y, z), (x, y, z)\}$. In other words, "x, y and/or z" means "one or more of x, y and z". As utilized herein, the term "exemplary" means serving as a non-limiting example, instance, or illustration. As utilized herein, the terms "e.g.," and "for example" set off lists of one or more non-limiting examples, instances, or illustrations. As utilized herein, circuitry or a device is "operable" to perform a function whenever the circuitry or device comprises the necessary hardware and code (if any is necessary) to perform the function, regardless of whether performance of the function is disabled or not enabled (e.g., by a user-configurable setting, factory trim, etc.).

Figure 1:
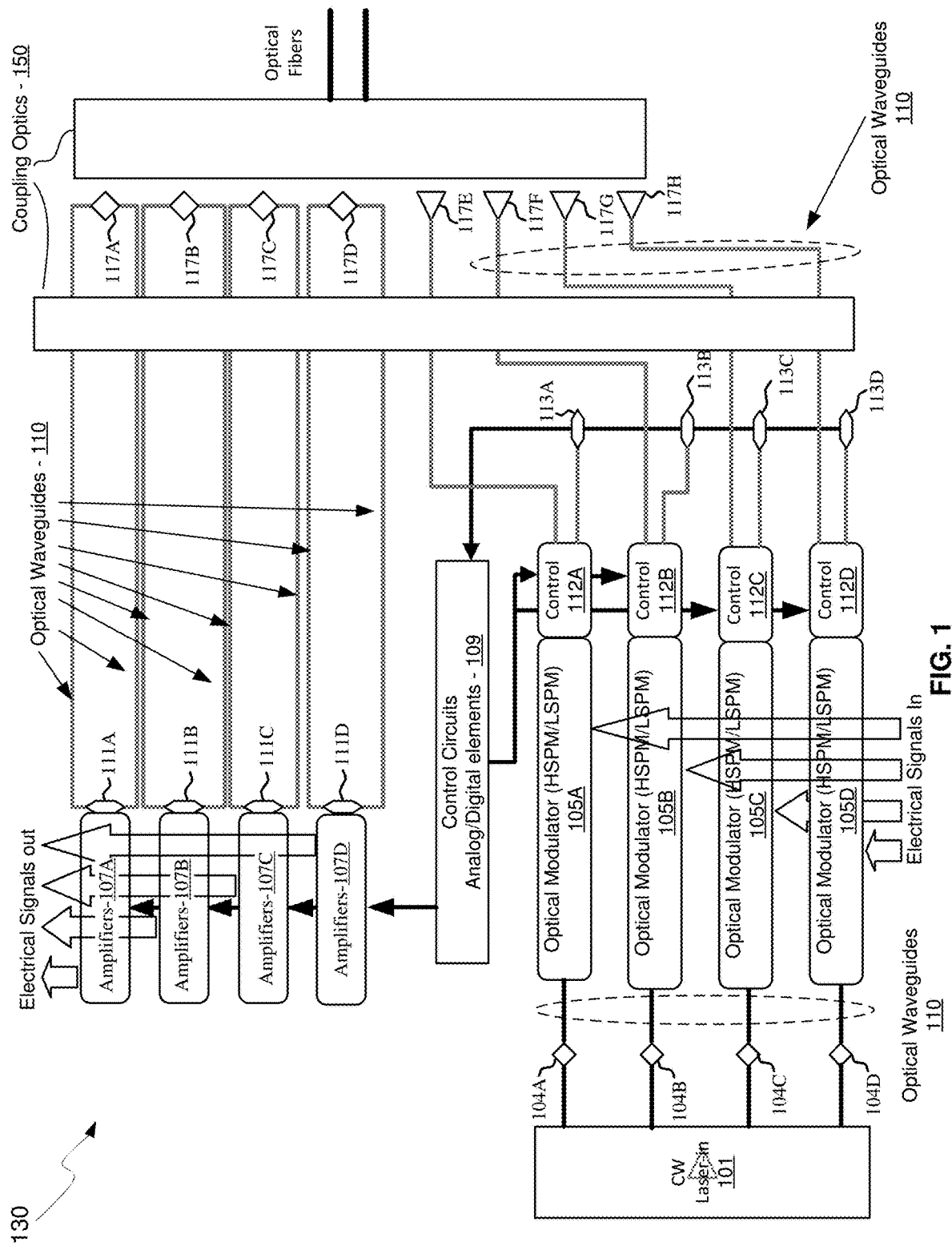
FIG. 1 is a block diagram of a photonically-enabled integrated circuit, in accordance with an example embodiment of the disclosure.

FIG. 1 is a block diagram of a photonically-enabled integrated circuit, in accordance with an example embodiment of the disclosure. Referring to FIG. 1, there are shown optoelectronic devices of a photonically-enabled integrated circuit 130 comprising optical modulators 105A-105D, photodiodes 111A-111D, monitor photodiodes 113A-113D, and optical devices comprising couplers 103A-103C and grating couplers 117A-117H. There are also shown electrical devices and circuits comprising amplifiers 107A-107D, analog and digital control circuits 109, and control sections 112A-112D. The amplifiers 107A-107D may comprise transimpedance and limiting amplifiers (TIA/LAs), for example. Optional coupling optics 150 may comprise beam splitters, thin film filters, mirrors, prisms, etc., and may be integrated on the interposer as well as external to the interposer.

In an example scenario, the photonically-enabled integrated circuit 130 comprises one or more CMOS electronics die coupled to a CMOS photonics interposer die with a laser assembly 101 also coupled to the top surface of the interposer. The laser assembly 101 may comprise one or more semiconductor lasers with isolators, lenses, and/or rotators for directing one or more continuous-wave (CW) optical signals to the couplers 104A-104D. The CW optical signals may be at different wavelengths for CWDM operation, such as CWDM4, for example. The photonically enabled integrated circuit 130 may be integrated on a plurality of die, such as with one or more electronics die and one or more photonics die.

The grating couplers 104A-104D comprise grating structures with grating spacing and width configured to couple optical signals of a specific wavelength and polarization into the IC 130. A lens array may be incorporated between the grating couplers 104A-104D and the laser assembly 101 for focusing of the optical signal to the grating couplers for increased coupling efficiency.

Optical signals are communicated between optical and optoelectronic devices via optical waveguides 110 fabricated in the photonically-enabled integrated circuit 130. Single-mode or multi-mode waveguides may be used in photonic integrated circuits. Single-mode operation enables direct connection to optical signal processing and networking elements. The term "single-mode" may be used for waveguides that support a single mode for each of the two polarizations, transverse-electric (TE) and transverse-magnetic (TM), or for waveguides that are truly single mode and only support one mode. Such one mode may have, for example, a polarization that is TE, which comprises an electric field parallel to the substrate supporting the waveguides. Two typical waveguide cross-sections that are utilized comprise strip waveguides and rib waveguides. Strip waveguides typically comprise a rectangular cross-section, whereas rib waveguides comprise a rib section on top of a waveguide slab. Of course, other waveguide cross section types are also contemplated and within the scope of the disclosure.

The optical modulators 105A-105D comprise Mach-Zehnder or ring modulators, for example, and enable the modulation of the continuous-wave (CW) laser input signals. The optical modulators 105A-105D may comprise high-speed and low-speed phase modulation sections and are controlled by the control sections 112A-112D. The high-speed phase modulation section of the optical modulators 105A-105D may modulate a CW light source signal with a data signal. The low-speed phase modulation section of the optical modulators 105A-105D may compensate for slowly varying phase factors such as those induced by mismatch between the waveguides, waveguide temperature, or waveguide stress and is referred to as the passive phase, or the passive biasing of the MZI.

In an example scenario, the high-speed optical phase modulators may operate based on the free carrier dispersion effect and may demonstrate a high overlap between the free carrier modulation region and the optical mode. High-speed phase modulation of an optical mode propagating in a waveguide is the building block of several types of signal encoding used for high data rate optical communications. Speed in the tens of Gb/s may be required to sustain the high data rates used in modern optical links and can be achieved in integrated Si photonics by modulating the depletion region of a PN junction placed across the waveguide carrying the optical beam. In order to increase the modulation efficiency and minimize the loss, the overlap between the optical mode and the depletion region of the PN junction must be carefully optimized.

One output of each of the optical modulators 105A-105D may be optically coupled via the waveguides 110 to the grating couplers 117E-117H. The other outputs of the optical modulators 105A-105D may be optically coupled to monitor photodiodes 113A-113D to provide a feedback path. The IC 130 may utilize waveguide based optical modulation and receiving functions. Accordingly, the receiver may employ an integrated waveguide photo-detector (PD), which may be implemented with epitaxial germanium/SiGe films deposited directly on silicon, for example.

The grating couplers 104A-104D and 117A-117H may comprise optical gratings that enable coupling of light into and out of the photonically-enabled integrated circuit 130. The grating couplers 117A-117D may be utilized to couple light received from optical fibers into the photonically-enabled integrated circuit 130, and the grating couplers 117E-117H may be utilized to couple light from the photonically-enabled integrated circuit 130 into optical fibers. The grating couplers 104A-104D and 117A-117H may comprise single polarization grating couplers (SPGC) and/or polarization splitting grating couplers (PSGC). In instances where a PSGC is utilized, two input, or output, waveguides may be utilized, as shown for grating couplers 117A-117D, although these may instead be SPGCs.

The optical fibers may be epoxied, for example, to the CMOS interposer, using a fiber coupler that selectively deflects optical signals of different wavelengths to and from different grating couplers on the chip 130, with each coupler, such as each of the grating couplers 117A-117H being configured to couple optical signals of different wavelengths.

The photodiodes 111A-111D may convert optical signals received from the grating couplers 117A-117D into electrical signals that are communicated to the amplifiers 107A-107D for processing. In another embodiment of the disclosure, the photodiodes 111A-111D may comprise high-speed heterojunction phototransistors, for example, and may comprise germanium (Ge) in the collector and base regions for absorption in the 1.3-1.6 µm optical wavelength range, and may be integrated on a CMOS silicon-on-insulator (SOI) wafer.

The analog and digital control circuits 109 may control gain levels or other parameters in the operation of the amplifiers 107A-107D, which may then communicate electrical signals off the photonically-enabled integrated circuit 130. The control sections 112A-112D comprise electronic circuitry that enables modulation of the CW laser signal received from the splitters 103A-103C. The optical modulators 105A-105D may require high-speed electrical signals to modulate the refractive index in respective branches of a Mach-Zehnder interferometer (MZI), for example.

In operation, the photonically-enabled integrated circuit 130 may be operable to transmit and/or receive and process optical signals. Optical signals may be received from optical fibers by the grating couplers 117A-117D and converted to electrical signals by the photodetectors 111A-111D. The electrical signals may be amplified by transimpedance amplifiers in the amplifiers 107A-107D, for example, and subsequently communicated to other electronic circuitry, not shown, in the photonically-enabled integrated circuit 130.

Integrated photonics platforms allow the full functionality of an optical transceiver to be integrated on a single chip or a plurality of chips in a flip-chip bonded structure. An optical transceiver contains optoelectronic circuits that create and process the optical/electrical signals on the transmitter (Tx) and the receiver (Rx) sides, as well as optical interfaces that couple the optical signals to and from a fiber. The signal processing functionality may include modulating the optical carrier, detecting the optical signal, splitting or combining data streams, and multiplexing or demultiplexing data on carriers with different wavelengths.

Figure 2:
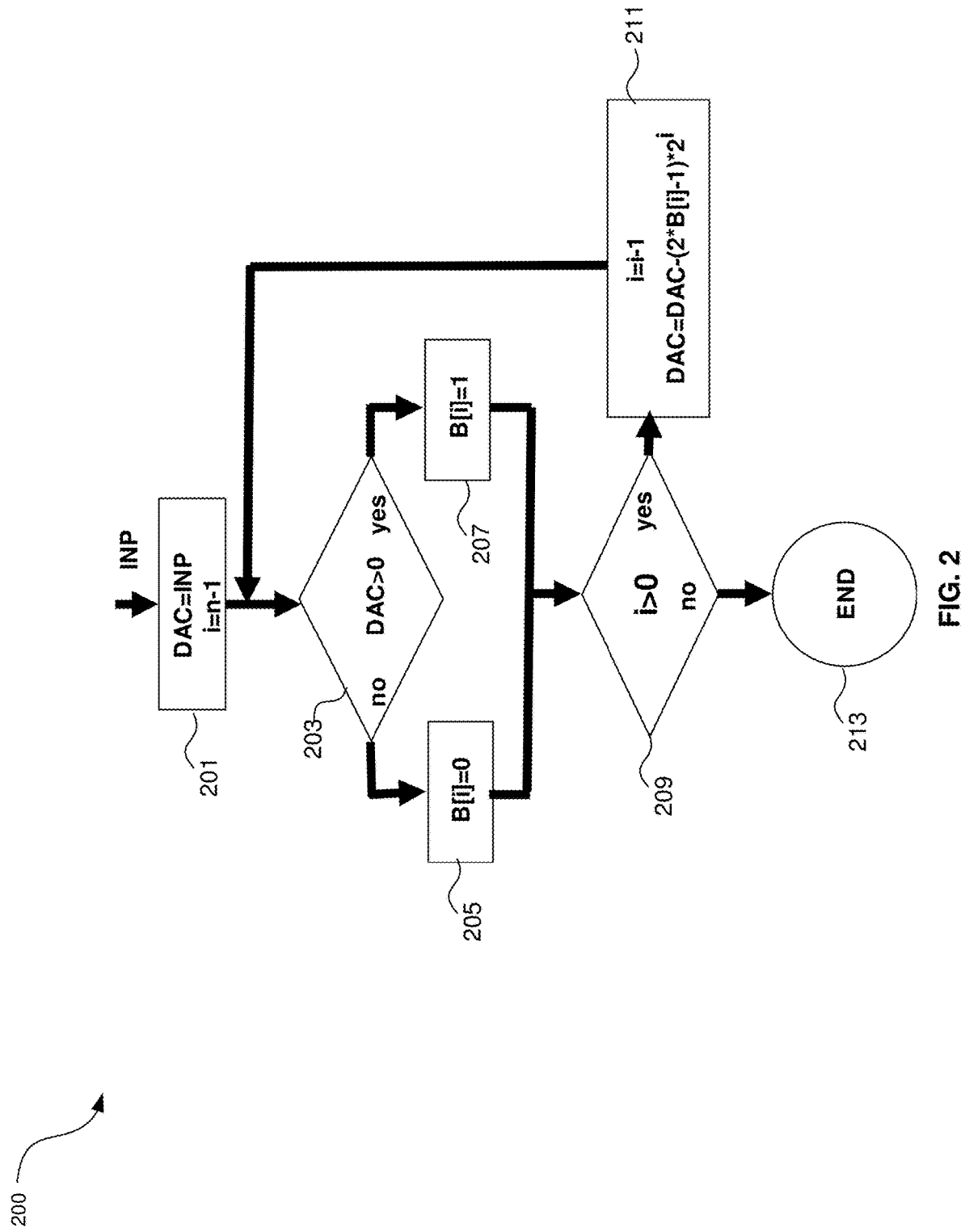
FIG. 2 is a flow diagram of the operation of a successive approximation register analog-to-digital converter, in accordance with an embodiment of the disclosure.

One aspect of the processing of the received signals is analog-to-digital conversion, where an analog signal received from the photodiodes 111A-111D, for example, is converted to digital signals by an analog-to-digital converter (ADC). One type of ADC is the successive approximation register (SAR) ADC. The SAR ADC architecture is the most effective of the high speed time interleaved ADCs, primarily due to the best achievable figure of merit compared to the other architectures. SAR ADCs execute a consecutive bit by bit search method starting from the most significant bit. An example of such a method for an ADC with n bits resolution is depicted in FIG. 2. The result of the method execution is the values of all n bits B[(n−1):0].

FIG. 2 is a flow diagram of the operation of a successive approximation register analog-to-digital converter, in accordance with an embodiment of the disclosure. Referring to FIG. 2, the search method starts with the most significant bit (MSB) and bit-by-bit moves down to the least significant bit (LSB). In step 201 the input signal INP is coupled to the input and sampled by assigning its value to a variable DAC. For the sake of simplicity, a symmetric, with respect to 0, input signal dynamic range is assumed $+/-2^{(n-1)}$, and the counter integer i is set to n−1, where n is the number of bits to be evaluated. In step 203, a differential comparator detects the signal polarity, resulting in a high or low at the comparator output.

If, in step 203, the comparator output is high, that bit is set to 1 in step 207 before proceeding to step 209, but if it is low, that bit is set to 0 before proceeding to step 209, where the value of counter integer i is tested. If it is greater than 0, the process proceeds to step 211 where the counter integer i is decremented by 1 and the DAC value is set to DAC−(2*B[i]−1)*$2^i$ before returning to step 203 for further bit comparisons, but if the value of counter integer i is 0, the process ends in End step 213.

Figure 3A:
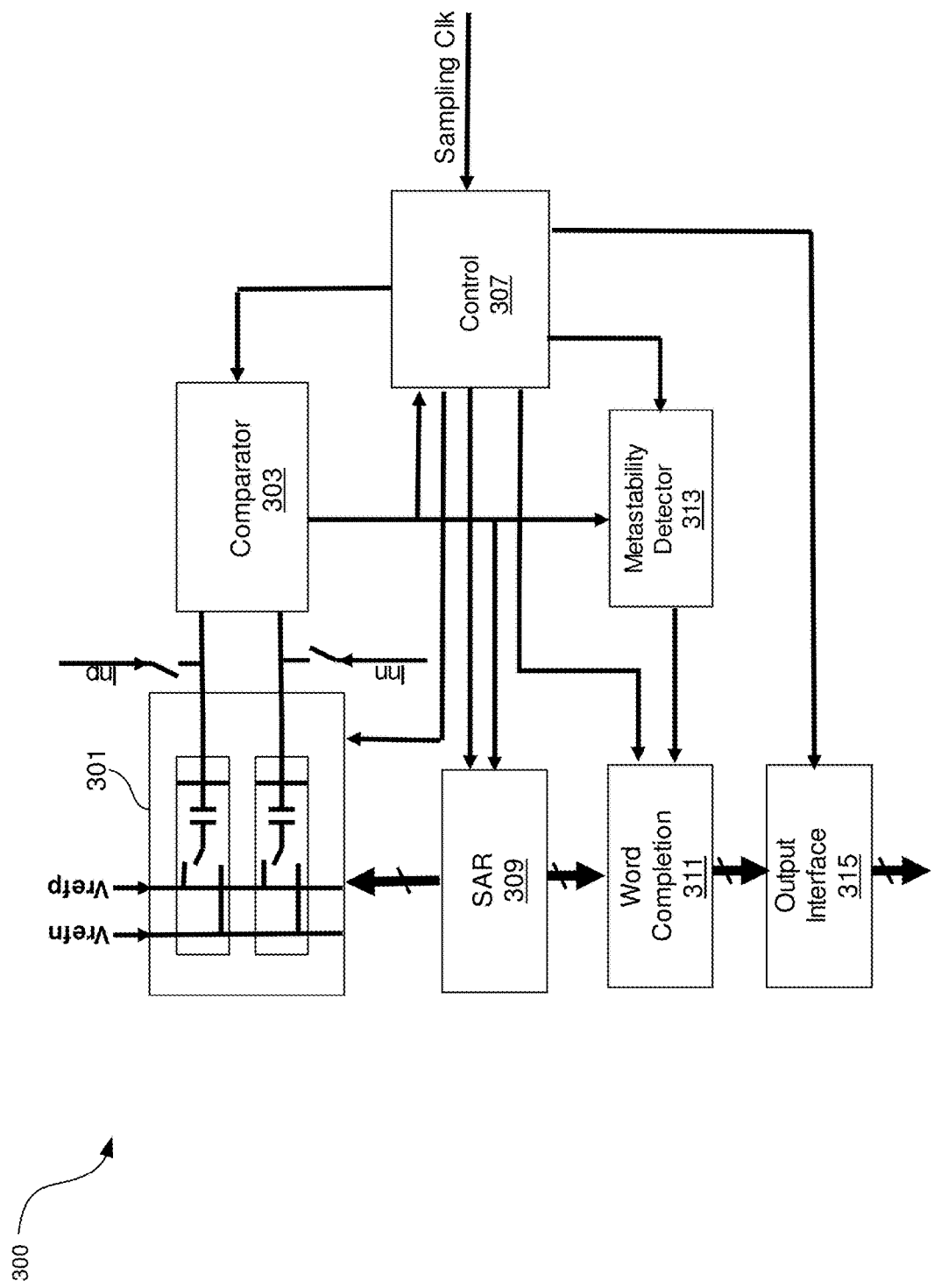
FIG. 3A illustrates a block diagram of an asynchronous top plate sampling SAR ADC, in accordance with an example embodiment of the disclosure.

FIG. 3A illustrates a block diagram of an asynchronous top plate sampling SAR ADC, in accordance with an example embodiment of the disclosure. Referring to FIG. 3A, the SAR ADC 300 comprises a switched capacitor digital-to-analog converter (DAC) 301, a comparator 303, a control block 307, a SAR block 309, word completion block 311, metastability detector 313, and output interface 315. The switched capacitor DAC 301 comprises an array of switched capacitors, with one pair shown, where a different pair of switched capacitors may be used for each bit to be converted.

The control block 307 receives an input clock used to sample the input signal and to initialize the conversion method. The other signals for controlling the conversion procedure, including the comparator clock, are derived from the comparator 303 outputs.

The SAR block 309 may hold the values of the converted bits and control the capacitor top plate switches of the switched capacitor DAC 301. The metastability detector 313 tags the bits with an extended evaluation time, which occurs when the voltages at the inputs of the comparator 303 are very close to each other, indicating that the conversion method has actually found the value of the signal to be converted. For this case, the bits values, which have been evaluated, may be used, while the rest of the bits may be calculated.

In this process, a synchronous clock may be utilized to start the conversion process, but then asynchronous timing may be utilized for each bit conversion, where once one is completed, the next one begins, and if that completion time is too long, a metastability flag is enabled for that bit.

Figure 3B:
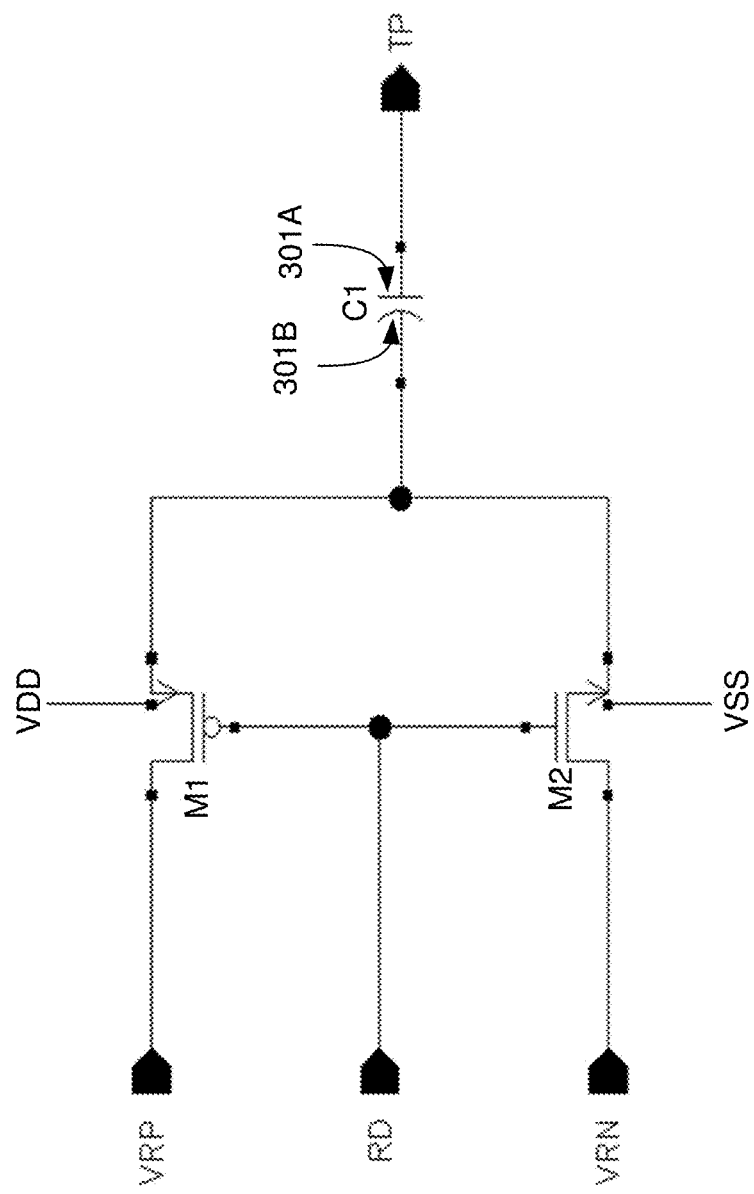
FIG. 3B illustrates a circuit diagram of a switched capacitor cell, in accordance with an example embodiment of the disclosure.

FIG. 3B illustrates a circuit diagram of a switched capacitor cell, in accordance with an example embodiment of the disclosure. Referring to FIG. 3B, there are shown transistors M1-M2 and a capacitor C1 with a top plate 301A and a bottom plate 301B. The transistors M1-M2 may comprise CMOS transistors, as shown in FIG. 3B, but the disclosure is not so limited, whereas other known transistor types may also be utilized. In FIG. 3B, the transistors M1-M2 are utilized as switches for switching different voltages to the capacitor C1, for example.

The cell comprises a unit capacitor C1, where the top plate 301A of which may be interconnected with the other cells of the capacitor array and connected to one of the comparator and ADC inputs. The other plate of the capacitor, the bottom plate 301B, may be coupled to the switches, the transistors M1-M2, where activating and deactivating the transistors M1 and M2 may couple desired voltages to the capacitor C1. A similar circuit to that shown in FIG. 3B may be utilized for the other input of FIG. 3A.

Figure 4:
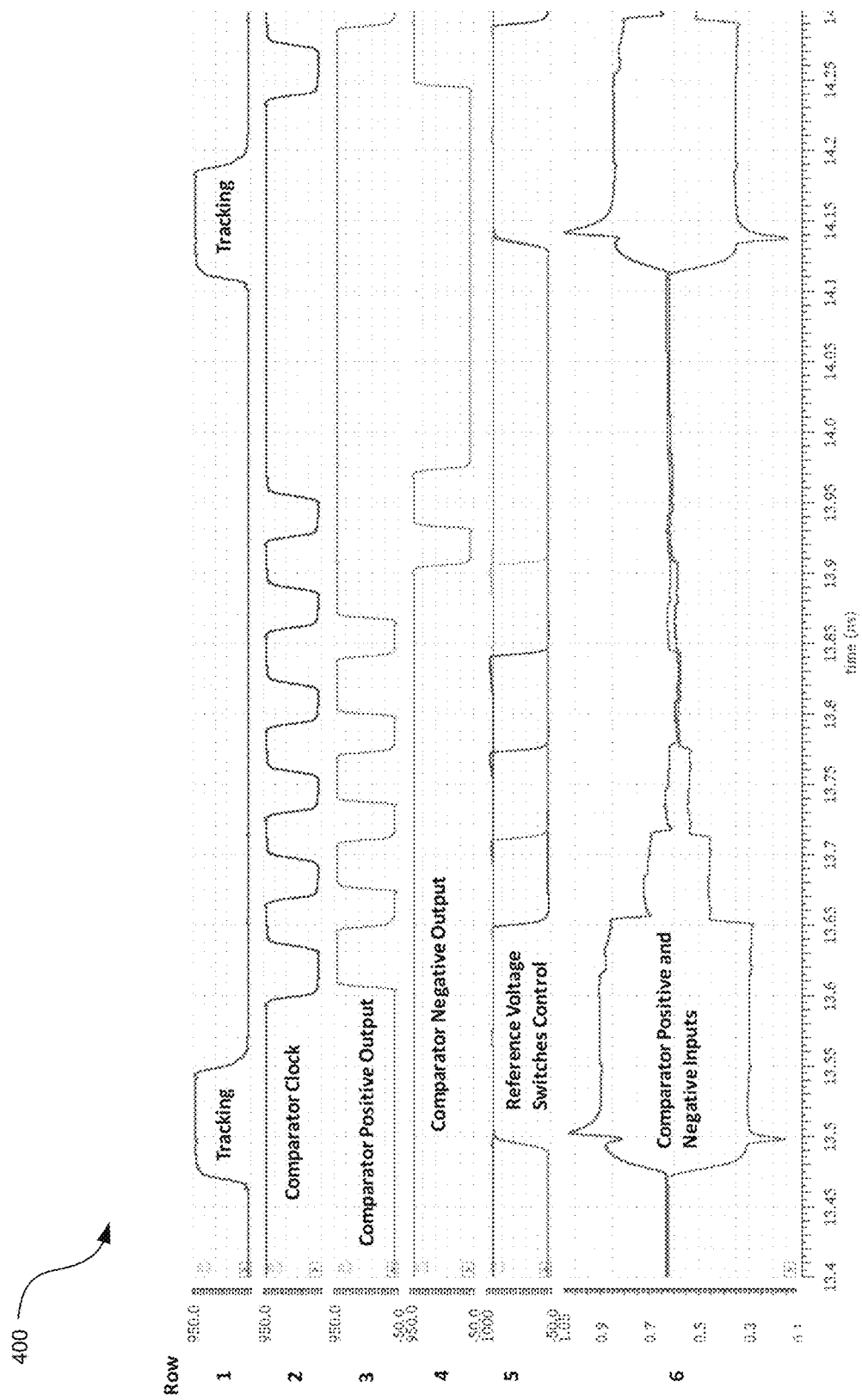
FIG. 4 illustrates timing diagrams for a SAR ADC, in accordance with an example embodiment of the disclosure.

FIG. 4 illustrates timing diagrams for a SAR ADC, in accordance with an example embodiment of the disclosure. The main control signals of the SAR ADC are depicted. The conversion cycle starts with the tracking clock signal enabling the ADC, tracking the input signal (row 1, time 13.47 ns). During this mode all the outputs of the SAR are reset to HIGH state (row 5, time 13.5 ns), thus reconnecting the capacitors C1 of FIG. 3B to the initial reference voltage pins VREFP and VREFN. One half of the cells in each binary weighted bit switched capacitor cell group may be connected to VREFP while the other half may be connected to VREFN. The group representing the least significant bit (LSB) might consist only of one capacitor cell. In this case both LSB cells of the differential DAC may be connected to the same reference voltage either VREFP or VREFN.

During the tracking mode of operation, all the top plates of the capacitors of the capacitor DAC and comparator inputs may be coupled to the ADC input nodes, thus tracking the ADC input voltage. After the end of the tracking mode (time 13.55 ns), the top plates of the capacitors of the switched capacitor DAC may be disconnected from the ADC inputs and the differential voltage at the comparator input, shown in the sixth row of the plot, becomes equal to the sampled input voltage. At approximately the same time, the comparator clock, depicted in the second row of the plot, enables the comparator reset mode (time 13.6 ns). Both comparator outputs may be reset to HIGH state, as shown in the third and fourth rows of the plot. After this moment, the comparator is ready to evaluate the value of the most significant bit (MSB). The comparator clock CLK shown in row 2 of the plot rises, enabling the comparator, after which the comparator evaluates the polarity of the DAC differential output signal and produces its output: one of the comparator outputs falls (time 13.65 ns) as indicated in row 3 of the plot.

The SAR 309 uses the comparator outputs (rows 3 and 4) to control the respective switches of the capacitor DAC (row 5). Depending on the polarity of the comparator output, one half of the respective bit capacitor group (MSB in this particular case) may be reconnected by the SAR 309 to the opposite reference voltage value (VREFP or VREFN) while the respective half of the group of capacitors of the opposite part of the differential capacitor DAC may be reconnected to a reference voltage of the opposite polarity, thus changing the comparator differential input voltage by one MSB value (row 6, time 13.65 ns). The connections of the other halves of the group of capacitors are unchanged.

At the same time, the control block 307 may detect the comparator output, turn the clock signal LOW and put the comparator into a reset mode. After ending the reset mode and after the comparator input differential voltage settles to the new value, the comparator 305 is ready to evaluate the next bit, and the comparator clock (CLK, second row) rises enabling the comparator. This procedure may be repeated for all the less significant bits capacitor groups except for the bit 1 capacitor cell, which might contain only one capacitor. In this case, only one capacitor of the differential DAC is interconnected between VREFP and VREFN.

The differential comparator may be operable to cancel the effect of an insignificant change of its input common mode voltage associated with such asymmetric switching. After the evaluation of the LSB (bit 0), there is no need for any capacitor switch. The conversion is completed after the comparator evaluates its input that is created by all the previous switching of the capacitors of the DAC.

During and after the LSB evaluation, the comparator clock may be locked in a high state, which enables adding all the time allocated for the ADC input signal tracking to the LSB evaluation cycle. Comparator topologies often use dynamic amplifier stages that are sensitive to the comparator input signal only during a short initial time interval of the active phase of the comparator clock. After the short active phase, the amplifier transistors normally go in triode or off mode of operation depending on the actual implementation. During this time, still being in a regenerative mode of operation, the comparator latch may be isolated from the comparator input, processing its internal nodes voltage difference generated by the dynamic amplifier during its active phase, which can take an extended time. If the comparator clock is held in an active state (for instance HIGH) during the tracking of the ADC input signal, as shown by CLK being high until 14.2 ns, the comparator latch can use all this time to get out of the regenerative phase, or metastability condition. In addition, the ADC sampled input signal will not be polluted by comparator kick-back noise generated by the comparator clock transition. This feature allows allocating more time for the evaluation of the more significant bits.

If the input voltages of the comparator of the SAR ADC are too close to each other, the comparator latch can stay abnormally long in a regeneration mode, a metastability condition, leaving not enough time for evaluation of less significant bits. On the other hand, if this condition occurs, the rest of the bits should be just complementary to the bit of the metastability To tag a bit with metastability, the duration of the comparator clock pulses is usually compared with a timing interval specially generated by a metastability timer. If the evaluation of any bit takes more time than the timer interval, the timer is able to produce a pulse, which is used to mark this specific bit. At the end of the symbol conversion cycle, if the LSB is not evaluated, the word completion method finds the bit marked with the metastability flag and assigns the opposite value to the rest of the lower significance bits. If the bit marked with the metastability flag is not completely finalized, it can be assigned with any value as long as the rest of the bits are assigned with the opposite value.

Implementation of this word completion method utilizes an additional timer, which is synchronized with the comparator clock and tuned to the comparator latch delay time. One purpose of this disclosure is to simplify the word completion block of the asynchronous SAR ADC by removing the timer and using pulses that are not synchronous with the comparator clock.

SAR ADCs are often used in time interleaved high frequency ADCs. They are placed in SAR ADC banks and may be activated one by one by the sampling clock pulses in a time interleaved fashion. In this case, the sampling pulses used to initiate the conversion of the other SAR ADCs of the same bank could be used in one SAR ADC to indicate the desired time intervals. Thus, the proposed new word completion method may use sampling pulses generated by the common for the SAR ADC bank sampling clock generator instead of the pulses generated by the timer located in every SAR ADC. Since the sampling pulses are not synchronous with the local SAR ADC comparator clock, the timing of the pulses should be carefully evaluated.

Figure 5A:
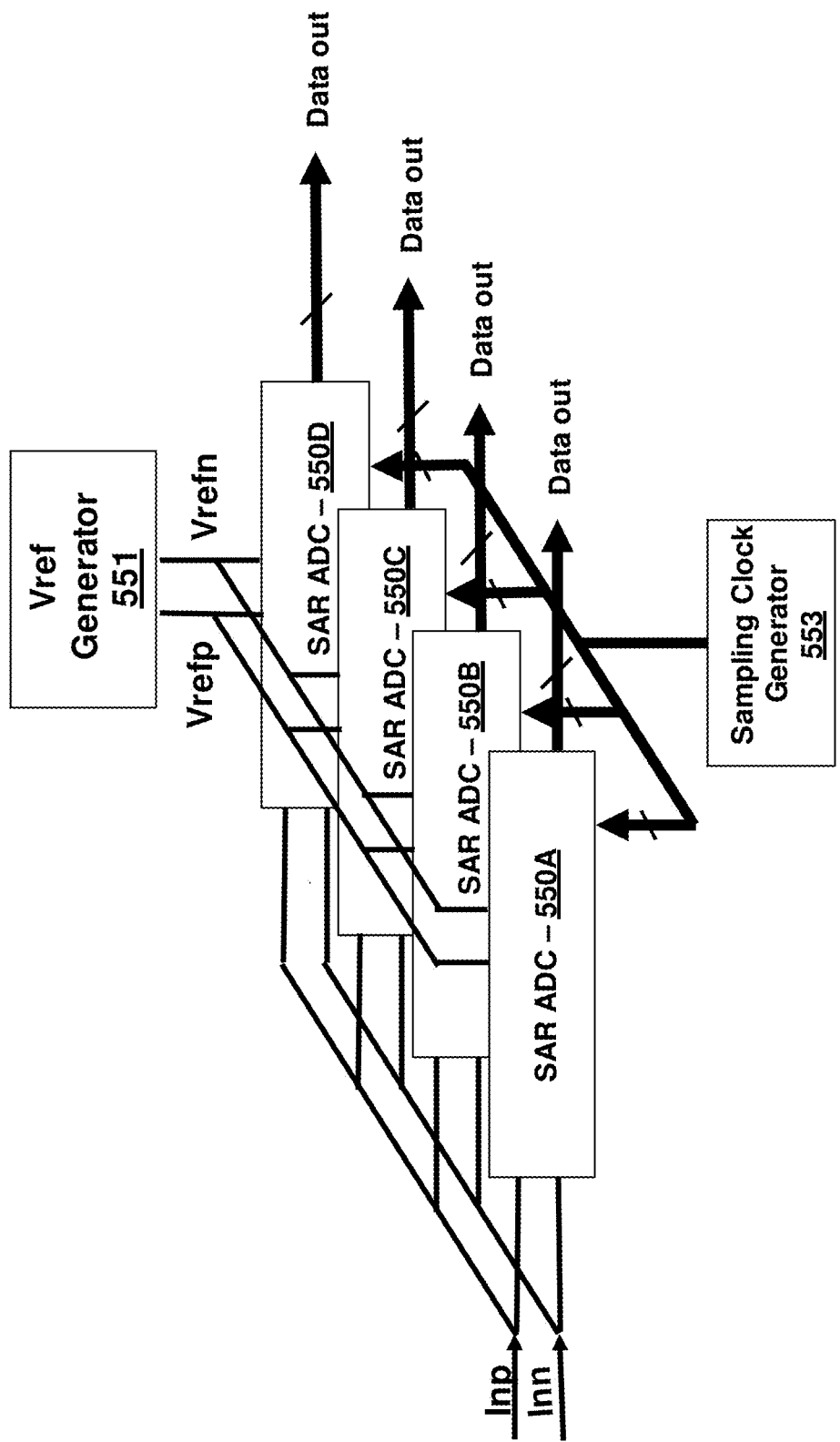
FIG. 5A illustrates a block diagram of a SAR ADC bank, in accordance with an example embodiment of the disclosure.

FIG. 5A illustrates a block diagram of a SAR ADC bank, in accordance with an example embodiment of the disclosure. Referring to FIG. 5A, there is shown a bank of SAR ADCs 550A-550D. In this example, the bank contains four SAR ADCs operating in time interleaved mode, although any number may be utilized, as well as a common reference voltage generator 551 and a sampling clock generator 553. The SAR ADCs 550A-550D share the input and reference voltage signals while the clock generator produces individual clock pulses as it will be described below.

Figure 5B:
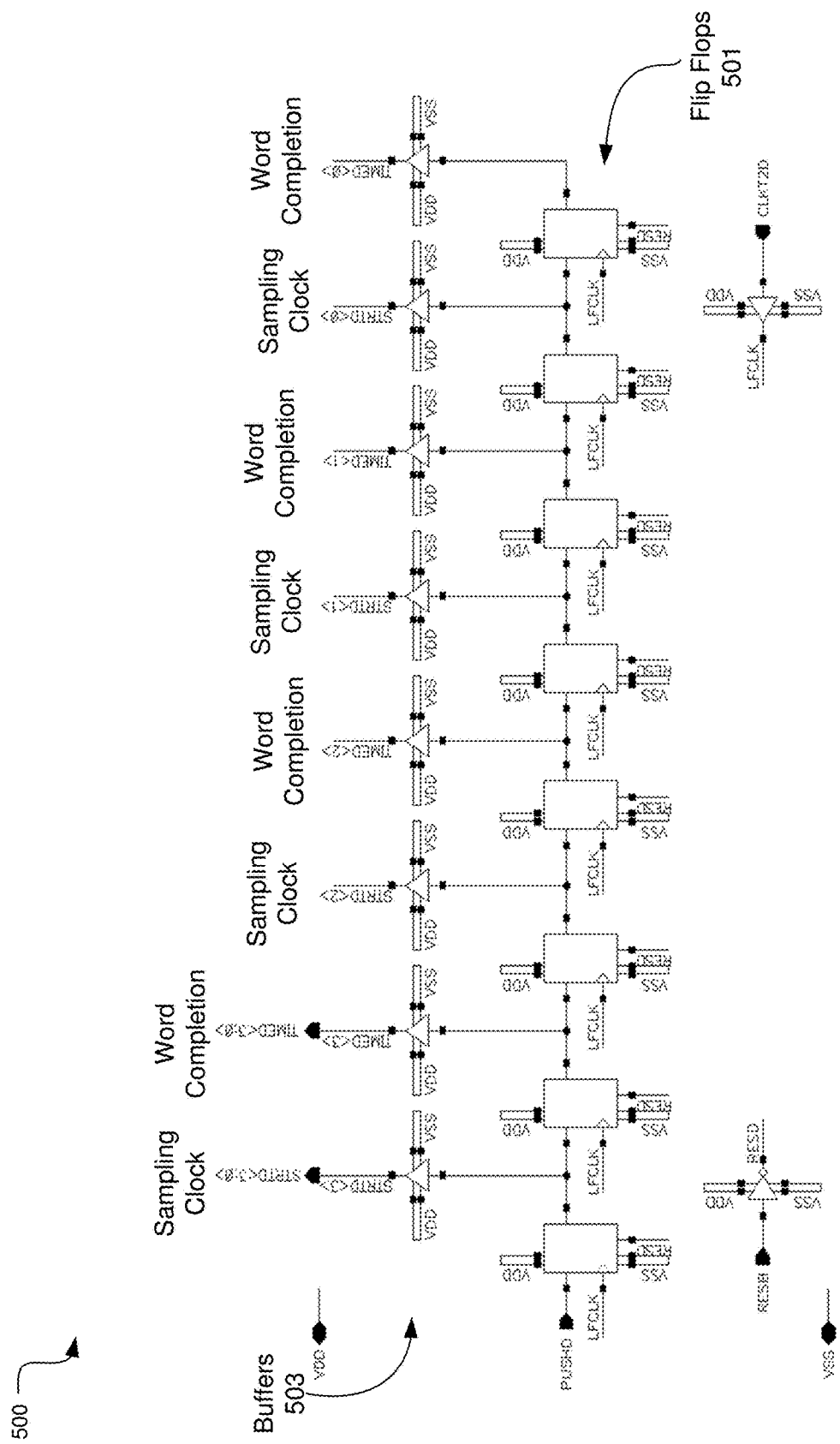
FIG. 5B illustrates a block diagram for generating sampling clocks in a SAR ADC bank containing four SAR ADCs operating in a time interleaved mode, in accordance with an example embodiment of the disclosure.

FIG. 5B illustrates a block diagram for generating sampling clocks in a SAR ADC bank containing four SAR ADCs operating in a time interleaved mode, in accordance with an example embodiment of the disclosure. Referring to FIG. 5B, there is shown clock generation circuit 500 comprising an array of flip-flops in a shift register with an array of buffers 503 at the outputs. The circuit 500 generates four sampling clocks STRD<3:0> with 0.125 duty cycle. The clocks may be shifted with respect to each other by two pulse widths. The shifting may be achieved by skipping all even flip-flop outputs of the shift register, resulting in a gap between the pulses equal to the pulse width. These pulses may also be used as time marks for the other SAR ADC word completion blocks. The other four pulses TIMED<3:0> may be used for the execution of the word completion method. Both groups of the pulses follow each other without a gap as it is apparent from the timing diagram of the clocks as shown in FIG. 6.

Figure 6:
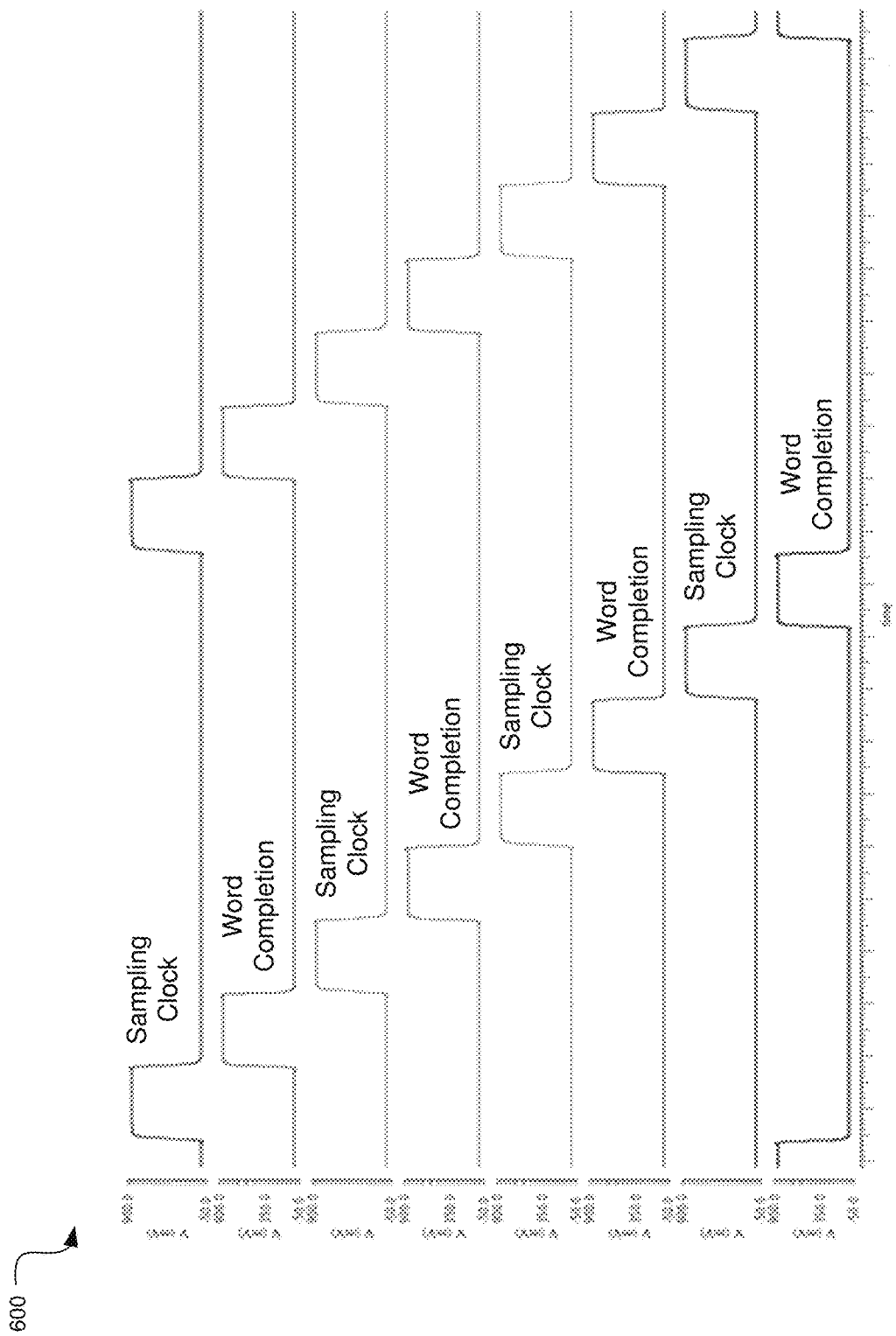
FIG. 6 illustrates timing diagrams for SAR ADC sampling clocks, in accordance with an example embodiment of the disclosure.

FIG. 6 illustrates timing diagrams for SAR ADC sampling clocks, in accordance with an example embodiment of the disclosure. Referring to FIG. 6, there is shown the clock signals generated by the circuit shown in FIG. 5, with each clock offset by a cycle. Each SAR ADC of the bank uses six clocks out of eight produced by the generator of FIG. 5.

Figure 7:
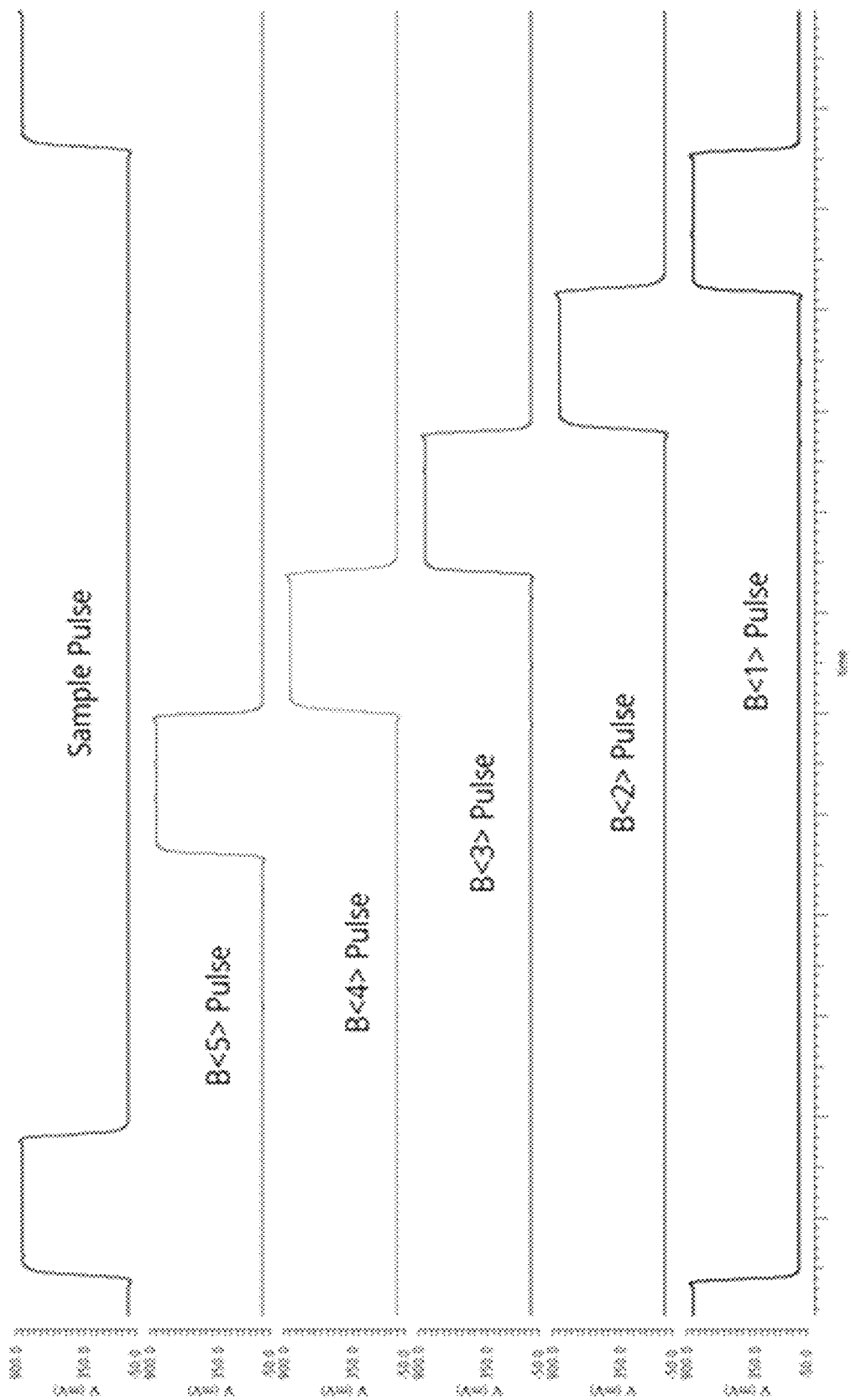
FIG. 7 depicts an example of the clock set used in a SAR ADC word completion block, in accordance with an example embodiment of the disclosure.

FIG. 7 depicts an example of the clock set used in a SAR ADC word completion block, in accordance with an example embodiment of the disclosure. The clock set shown may be used for generating flags tagging the bits with possible metastability. The pulse used for B<5> is lagging the sampling pulse by two pulse width intervals while all the other pulses used for B<4:1> follow each other without a gap.

Figure 8:
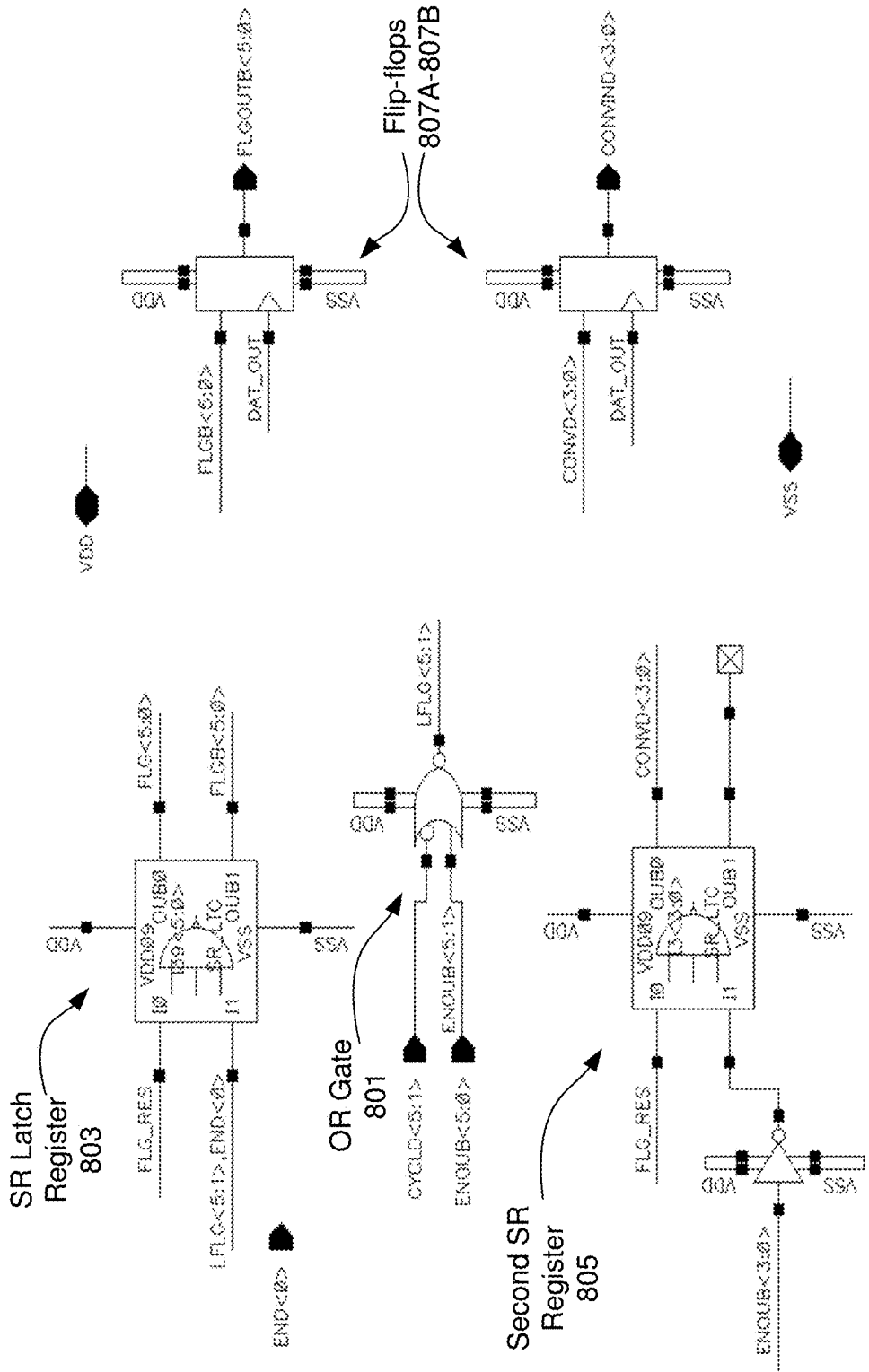
FIG. 8 illustrates a block diagram of a metastability flag generator, in accordance with an example embodiment of the disclosure.

FIG. 8 illustrates a block diagram of a metastability flag generator, in accordance with an example embodiment of the disclosure. As shown in FIG. 8, there is shown an OR gate 801 combining the specific bit-conversion-enable pulses and the clock pulses described above. If some of the bit-conversion-enable pulse overlaps with the corresponding clock pulse, meaning that the bit conversion time is longer than a threshold time defined by timing of the bit conversion pulses and the sampling clock pulses, a metastability flag is generated. Bit <0> does not need any flag generation, however a pulse, indicating the successful start of B<0> evaluation is marked as FLGB<0>. Presence of this pulse indicates a complete conversion of the sampled signal. The flags are stored in a SR latch register 803. The pulses indicating successful conversion of the more significant bits, Bit<1> through Bit<4>, are stored in a separate SR latch register 805. The content of that register may be used to determine the last successfully evaluated bit during the conversion procedure, if bit 0 is not evaluated. The content of both SR registers 803 and 805 may be sent to the word completion block by a set of flip-flops 807A and 807B.

Figure 9:
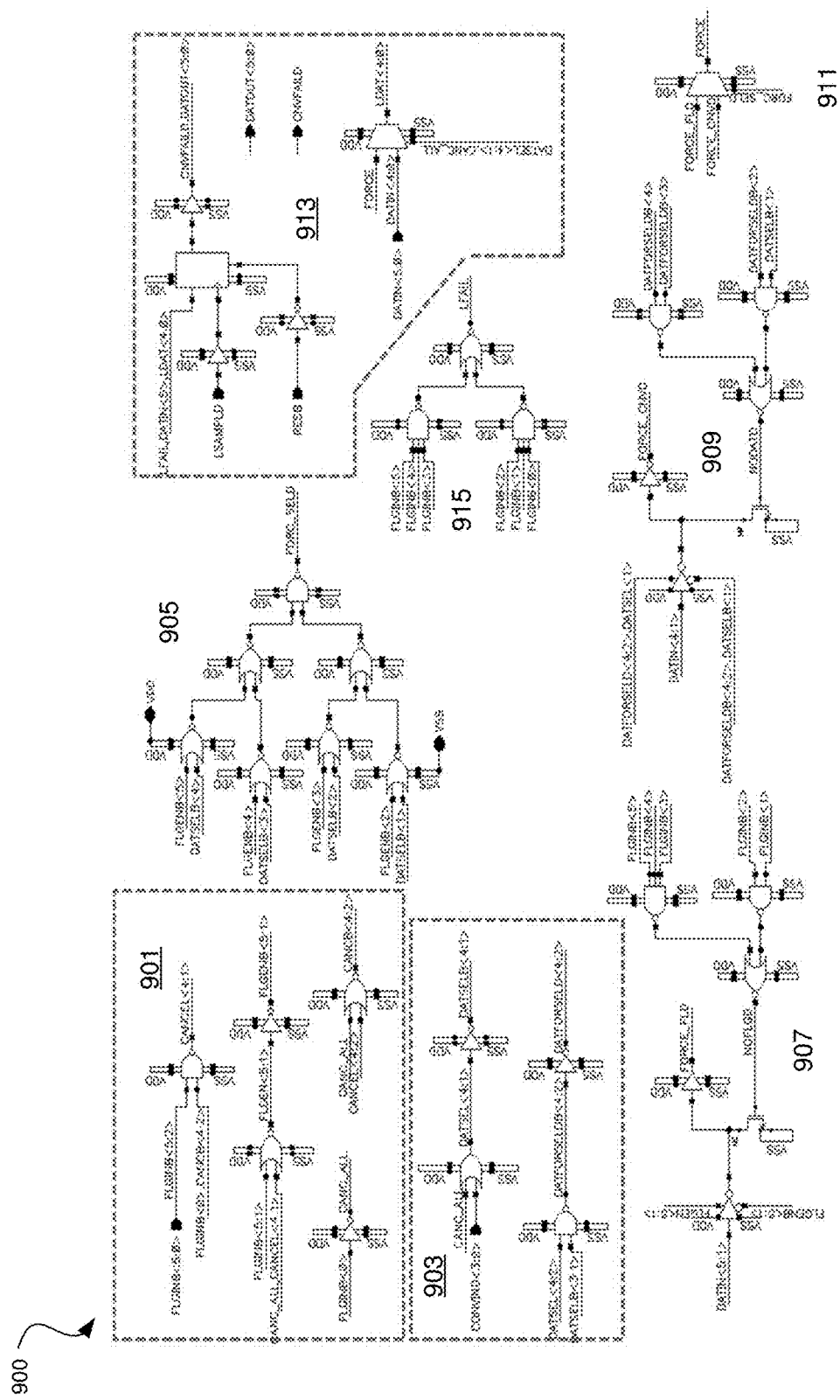
FIG. 9 illustrates a block diagram of components of a word completion block, in accordance with an example embodiment of the disclosure.

FIG. 9 illustrates a block diagram of components of a word completion block, in accordance with an example embodiment of the disclosure. The completion block 900 components may comprise logic gates 901, 903, 905, 907, 909, and 913, multiplexer 911, and output interface logic 913.

The word completion block 900 may execute the following functions. If FLGB<0> is present (LOW), all the flags with higher indexes may be canceled, thus indicating no metastability event. In this case all six evaluated bits may be sent unchanged to the output flip-flop. If FLGB<0> is HIGH indicating that B <0> has not been evaluated, only the flag with the highest index is left and all the flags with lower indexes may be cancelled because a delayed evaluation of any more significant bit causes evaluation delay of all the following bits, so that the false flags corresponding to those bits will be generated as well. These actions may be executed by logic gates 901 of FIG. 9. The lowest index of the evaluated bit is determined by logic gates 903. It may be determined by logic gates 905 whether the index of metastability flag is greater than the index of the last evaluated bit. It may also be determined whether there is valid data with index lower than the suspected metastability bit. Block 907 selects the data marked with the highest index flag, while block 909 selects the valid data with the lowest index. Finally, using the output of logic 905, the multiplexer 911 selects either the data of logic 907 or data of logic 909.

Then, in case of a metastability event (FLGB<0> is HIGH), the block executes the following method of the word completion: a) If there is no valid data with the index lower than the index of the bit with metastability, all the missing bits may be generated complementary to the bit of metastability; and b) If there is valid data with index lower than the suspected metastability bit, all the missing bits may be generated equal to the successfully converted bit with the lowest index. This action is executed by output interface logic 913. Logic 915 generates a conversion failure indicator pulse for the case when none of the flags is generated during the conversion cycle, meaning that the LSB is not evaluated and at the same time there are no more significant bit flags to be used to recover the data.

The word completion block may receive its data at the end of each conversion cycle of the sampled input signal when all the bits values are available, and has up to the whole conversion cycle time interval until the next data arrival. This time is sufficient to resolve all metastability conditions happening in the word completion block itself and to send the final data out by a set of flip-flops.

Since two pulse intervals are allocated for B<5>, as shown in FIG. 7, generation of a metastability flag for B<5> indeed indicates a metastability event, thus all the actions of the word completion block should produce an accurate result. Generating a flag for any bits B<4:2> might be caused by a metastability event either during evaluation of the respective bit or any previous bit with a higher index. If no valid data is available after the first bit tagged with the flag, this should mean that the metastability indeed took place specifically during this bit evaluation and word completion block indeed should assign the complementary values to the missing bits in order to produce an accurate result. If there is valid data with lower indexes, it does not matter which more significant bit had the metastability event because all the missing bits should be equal to the last available valid bit. Thus, the word completion method should produce a valid result as well.

Generating a flag for only B<1> under the condition of not complete B<0> conversion indicates a metastability event at B<1>, because this should only happen when the bit evaluation takes two clock intervals. Thus, the word completion block assigns the complementary value to B<0>.

A situation when no flags for more significant bits are generated and the LSB is not evaluated is avoided because in this case the LSB evaluation should start before the B<1> pulse of FIG. 7 and this action immediately generates a flag of the complete evaluation of the LSB. Under this condition, two pulse time intervals are allocated for the LSB evaluation. If even after this time the comparator is still stuck in a metastability condition, the LSB can be assigned with any value without accuracy compromise.

The proposed new word completion method works most successfully if the conversion time of a typical sample of the ADC input voltage has a sufficient margin. In other words, if the differential input voltage of the comparator does not go below one LSB voltage value during the conversion of all the bits B<5:1>, the conversion of B<1> should be finalized without a metastability flag.

This margin is utilized to avoid the conditions when the conversion was delayed bit by bit and false flags are produced for the earlier bits masking the metastability events at B<1> that was not successfully evaluated. In this case, B<0> might be assigned with a wrong value. This condition does not limit the usage of the proposed word completion because any reasonable SAR ADC design must have a sufficient time margin just for reliable functionality and acceptable yield. In the present case the minimal required margin is approximately 15%, which is not difficult to satisfy.

Figure 10:
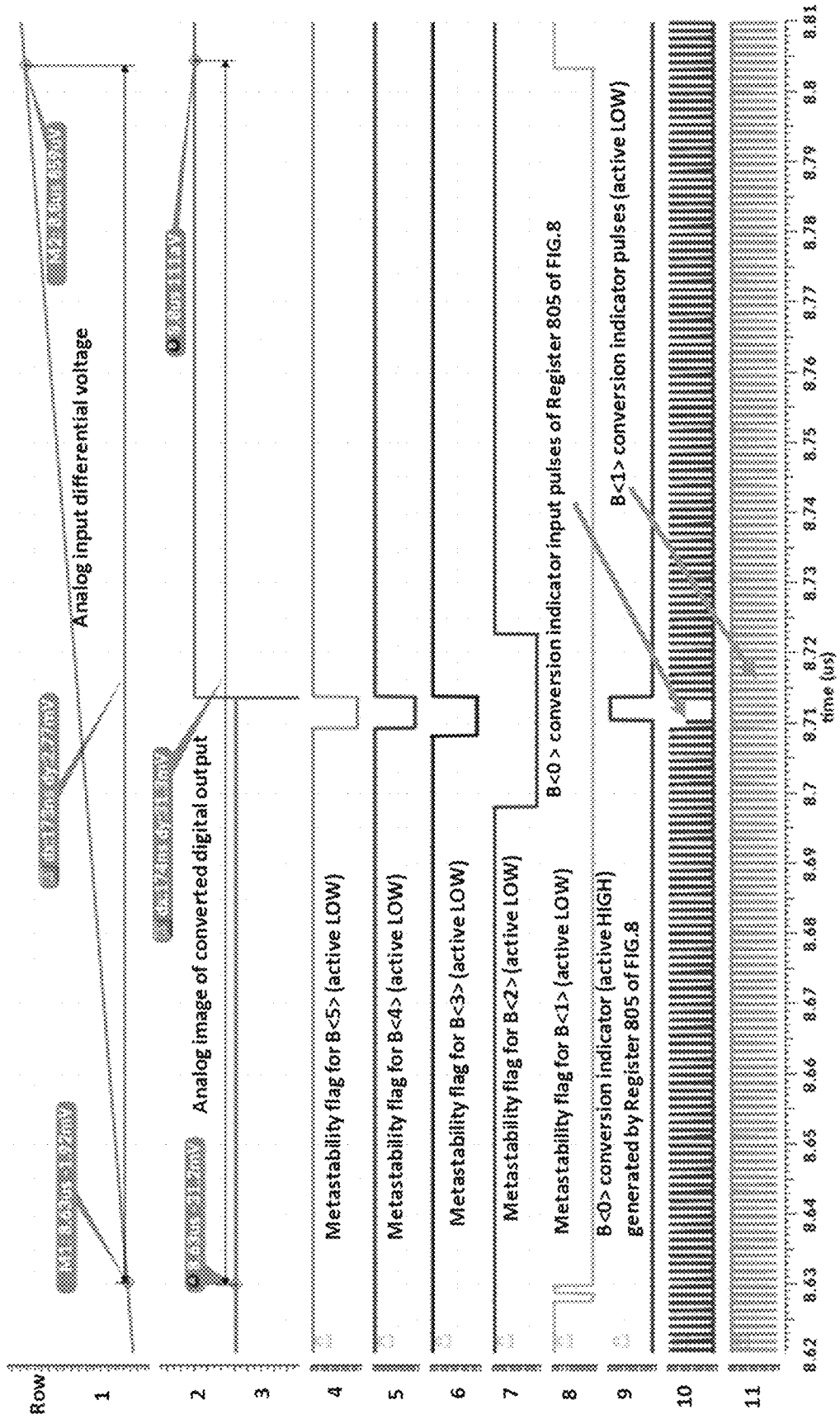
FIGS. 10 and 11 illustrate SAR ADC modeling results, in accordance with an example embodiment of the disclosure.
Figure 11:
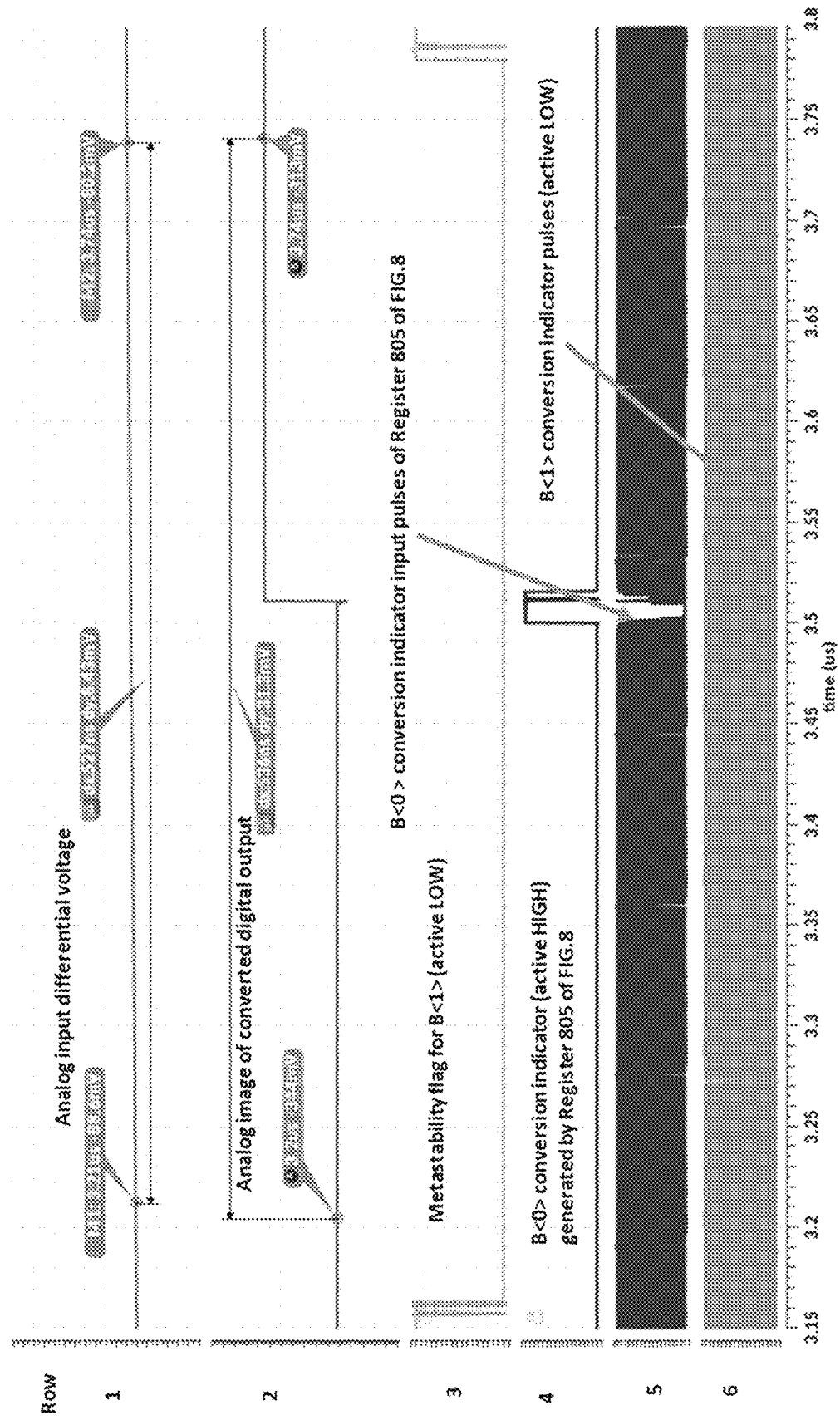

The functionality of the new word completion method is confirmed by the simulation results depicted in FIGS. 10 and 11.

FIGS. 10 and 11 illustrate SAR ADC modeling results, in accordance with an example of the disclosure. The results are obtained by tripling the parasitic capacitances of the SAR ADC comparator latch and applying a very slow voltage ramp to the SAR ADC input as shown by the sloped input different voltage line in FIGS. 10 and 11. Those conditions allow producing metastability events during all bit evaluations at different conversion cycles. FIG. 10 illustrates developing metastability conditions during the evaluation of B<5>.

It is apparent that although the metastability conditions are developing during the evaluation of B<5>, the metastability flags initially are generated during the evaluation of the less significant bits. These false flags are ignored for the whole time when B<0> is successfully evaluated as indicated in the third row from the bottom of FIG. 10. When B<0> is not evaluated, all the bits including B<5> already have metastability flags, and since B<1> is always evaluated, as indicated in the bottom row of FIG. 10, the value of B<1> is assigned to the missing value of B<0>.

FIG. 11 illustrates developing metastability conditions during the evaluation of B<1>. The legend of this plot is the same as in FIG. 10, and it is apparent that in the case of metastability of B<1>, only B<1> is marked with a metastability flag. During the conversion cycles when B<0> is not successfully evaluated because of the metastability event during evaluation of bit B<1>, the value opposite of B<1> is assigned to B<0>.

In both cases presented in FIGS. 10 and 11, the converted output shown in the second row shows just one LSB transition without any toggling during all those events thus confirming the high accuracy of the disclosed method.

In an example embodiment of the disclosure, a method and system are described for an asynchronous successive approximation register analog-to-digital converter with word completion function. The method may comprise, in a bank of successive approximation register analog-to-digital converters (SAR ADCs), where each SAR ADC comprises a switched capacitor digital-to-analog converter (DAC), a word completion block, a comparator, and a metastability detector: sampling a received analog electrical signal using the switched capacitor DAC; converting the received analog electrical signal to an n-bit digital signal by evaluating bits from a most significant bit to a least significant bit using the comparator, wherein if the metastability detector determines that a time to evaluate one of the bits is longer than a threshold time, the metastability detector generates a metastability flag for each such bit.

The consecutive bit converting may be initiated in a first SAR ADC using a conversion enable clock pulse generated in the first SAR ADC. The sampling clock pulses and delayed versions of the sampling clock pulses, controlling other SAR ADCs in the bank of SAR ADCs operating in a time interleaved mode, may be used for the metastability flag generation.

The sampling clock of a second SAR ADC in the bank of SAR ADCs or its delayed version, which is used for the most significant bit metastability flag generation, may be delayed with respect to the first SAR ADC sampling clock by one or more clock intervals, while all other pulses used for less significant bits may follow each other without a gap.

The metastability flag may be generated when a conversion enable pulse overlaps with a sampling clock pulse. The conversion of the symbol sampled by the SAR ADC is considered completed successfully, if the conversion of the least significant bit started before a next SAR ADC sampling pulse. If the least significant bit flag is not converted, the word completion block may determine the index of the most significant bit with a metastability flag and compare the index to the index of the last less significant evaluated bit.

The word completion block sets all less significant bits to: complementary values of the most significant bit with a metastability flag if there is no valid data for bits with an index lower than the index of the most significant bit with a metastability flag; or the same value as the successfully converted bit with the lowest index, if there is valid data for bits with an index lower than the most significant bit with a metastability flag.

Metastability flags may be stored in a first SR latch register in the metastability detector and successfully converted bit indicators may be stored in a second SR latch register in the metastability detector. Contents of the first and second SR latch registers may be communicated to the word completion block.

While the present disclosure has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for communication, the method comprising:
in a bank of successive approximation register analog-to-digital converters (SAR ADCs), each of the SAR ADCs comprising a digital-to-analog converter (DAC), a comparator, and a metastability detector:
sampling a received analog electrical signal using the DAC controlled by sampling clock pulses; and
converting the received analog electrical signal to an n-bit digital signal by evaluating bits using the comparator in each of the SAR ADCs, wherein the converting is initiated using a conversion enable clock pulse generated in a first SAR ADC and wherein if a metastability detector determines that a time to evaluate one of the bits is longer than a threshold time, the metastability detector generates a metastability flag for each such bit.

2. The method according to claim 1, comprising using the sampling clock pulses controlling other of said SAR ADCs to generate metastability flags.

3. The method according to claim 2, comprising generating a metastability flag when a conversion enable pulse overlaps with a sampling clock pulse.

4. The method according to claim 1, wherein a sampling clock of a second SAR ADC is used for most significant bit metastability flag generation and is delayed with respect to a sampling clock of the first SAR ADC by one or more clock intervals.

5. The method according to claim 4, wherein a symbol sampled by the bank of SAR ADCs is successfully converted if a conversion of a least significant bit starts before a next SAR ADC sampling pulse.

6. The method according to claim 1, wherein if a least significant bit is not converted, a word completion block determines an index of a most significant bit with a metastability flag and compares the index to an index of a last evaluated bit.

7. The method according to claim 6, wherein:
if the index of the most significant bit with a metastability flag is greater than the index of the last evaluated bit, the word completion block sets all less significant bits to:
complementary values of the most significant bit with a metastability flag if there is no valid data for bits with an index of the most significant bit with a metastability flag; or
a same value as a successfully converted bit with the lowest index if there is valid data for bits with index lower than the most significant bit with a metastability flag.

8. The method according to claim 1, comprising storing metastability flags in a first SR latch register in the metastability detector.

9. The method according to claim 8, comprising storing successfully converted bit indicators in a second SR latch register in the metastability detector.

10. The method according to claim 9, comprising communicating contents of the first and second SR latch registers to a word completion block.

11. A system for communication, the system comprising:
a bank of successive approximation register analog-to-digital converter (SAR ADCs), each of the SAR ADCs comprising a digital-to-analog converter (DAC), a word completion block, a comparator, and a metastability detector, each of the SAR ADCs being operable to:
sample a received analog electrical signal using the DAC controlled by sampling clock pulses; and
convert the received analog electrical signal to an n-bit digital signal by evaluating bits from a most significant bit to a least significant bit using the comparator in each of the SAR ADCs, wherein if the metastability detector determines that a time to evaluate one of the bits is longer than a threshold time, the metastability detector generates a metastability flag for each such bit, and wherein if the least significant bit is not converted, the word completion block determines an index of a most significant bit with a metastability flag and compares the index to an index of a last evaluated bit.

12. The system according to claim 11, wherein the bank of SAR ADCs is operable to initiate the converting using a conversion enable pulse in a first SAR ADC.

13. The system according to claim 12, wherein the sampling clock pulses controlling other of said SAR ADCs is used to generate metastability flags.

14. The system according to claim 12, wherein the first SAR ADC is operable to generate a metastability flag when a conversion enable pulse overlaps with a sampling clock pulse.

15. The system according to claim 14, wherein a sampling clock of a second SAR ADC is used for most significant bit metastability flag generation and is delayed with respect to a sampling clock of the first SAR ADC by one or more clock intervals.

16. The system according to claim 14, wherein conversion of symbol sampled by the bank of SAR ADCs is successfully converted if the conversion of the least significant bit starts before a next SAR ADC sampling pulse.

17. The system according to claim 11, wherein:
if the index of the most significant bit with a metastability flag is greater than the index of the last evaluated bit, the word completion block sets all less significant bits to:
complementary values of the most significant bit with a metastability flag if there is no valid data for bits with an index lower than the index of the most significant bit with a metastability flag; or
a same value as a successfully converted bit with the lowest index if there is valid data for bits with index lower than the most significant bit with a metastability flag.

18. The system according to claim 11, wherein the bank of SAR ADCS is operable to store metastability flags in a first SR latch register in the metastability detector and store successfully converted bit indicators in a second SR latch register in the metastability detector.

19. The system according to claim 18, wherein the bank of SAR ADCs is operable to communicating contents of the first and second SR latch registers to the word completion block.

20. A system for communication, the system comprising:
a bank of successive approximation register analog-to-digital convertors (SAR ADCs), each of the SAR ADCs comprising a digital-to-analog convertor (DAC), a comparator, and a metastability detector, each of the SAR ADCs being operable to:
sample a received analog electrical signal using the DAC controlled by sampling pulses; and
convert the received analog electrical signal to an n-bit digital signal by evaluating bits from a most significant bit to a least significant bit using the comparator in each of the SAR ADCs, wherein if the metastability detector determines that time to evaluate one of the bits is longer than a threshold time, the metastability detector generates a metastability flag for each such bit and sets subsequent bits to complementary values of a most significant bit with a metastability flag or to the same values as the most significant bit with a metastability flag.

21. A system for communication, the system comprising:
a bank of successive approximation register analog-to-digital converter (SAR ADCs), each of the SAR ADCs comprising a digital-to-analog converter (DAC), a comparator, and a metastability detector, each of the SAR ADCs being operable to:
sample a received analog electrical signal using the DAC controlled by sampling clock pulses; and
convert the received analog electrical signal to an n-bit digital signal by evaluating bits using the comparator in each of the SAR ADCs, wherein if the metastability detector determines that a time to evaluate one of the bits is longer than a threshold time, the metastability detector generates a metastability flag for each such bit, and wherein a sampling clock of a first SAR ADC is used for most significant bit metastability flag generation and is delayed with respect to a second SAR ADC sampling clock by one or more clock intervals.

22. A system for communication, the system comprising:
a bank of successive approximation register analog-to-digital converter (SAR ADCs), each of the SAR ADCs comprising a digital-to-analog converter (DAC), a comparator, and a metastability detector, each of the SAR ADCs being operable to:
sample a received analog electrical signal using the DAC controlled by sampling clock pulses;
convert the received analog electrical signal to an n-bit digital signal by evaluating bits using the comparator in each of the SAR ADCs, wherein if the metastability detector determines that a time to evaluate one of the bits is longer than a threshold time, the metastability detector generates a metastability flag for each such bit; and
store metastability flags in a first SR latch register in the metastability detector.

23. A system for communication, the system comprising:
a bank of successive approximation register analog-to-digital converters (SAR ADCs), each of the SAR ADCs comprising a digital-to-analog converter (DAC), a comparator, and a metastability detector, each of the SAR ADCs being operable to:
sample a received analog electrical signal using the DAC controlled by sampling clock pulses; and
convert the received analog electrical signal to an n-bit digital signal by evaluating bits using the comparator in each of the SAR ADCs, wherein the converting is initiated using a conversion enable clock pulse generated in a first SAR ADC and wherein if a metastability detector determines that a time to evaluate one of the bits is longer than a threshold time, the metastability detector generates a metastability flag for each such bit.

24. A method for communication, the method comprising:
in a bank of successive approximation register analog-to-digital converter (SAR ADCs), each of the SAR ADCs comprising a digital-to-analog converter (DAC), a word completion block, a comparator, and a metastability detector:
   sampling a received analog electrical signal using the DAC controlled by sampling clock pulses; and
   converting the received analog electrical signal to an n-bit digital signal by evaluating bits from a most significant bit to a least significant bit using the comparator in each of the SAR ADCs, wherein if the metastability detector determines that a time to evaluate one of the bits is longer than a threshold time, the metastability detector generates a metastability flag for each such bit, and wherein if the least significant bit is not converted, the word completion block determines an index of a most significant bit with a metastability flag and compares the index to an index of a last evaluated bit.

25. A method for communication, the method comprising:
in a bank of successive approximation register analog-to-digital converter (SAR ADCs), each of the SAR ADCs comprising a digital-to-analog converter (DAC), a comparator, and a metastability detector:
   sampling a received analog electrical signal using the DAC controlled by sampling clock pulses; and
   converting the received analog electrical signal to an n-bit digital signal by evaluating bits using the comparator in each of the SAR ADCs, wherein if the metastability detector determines that a time to evaluate one of the bits is longer than a threshold time, the metastability detector generates a metastability flag for each such bit, and wherein a sampling clock of a first SAR ADC is used for most significant bit metastability flag generation and is delayed with respect to a second SAR ADC sampling clock by one or more clock intervals.

26. A method for communication, the method comprising:
in a bank of successive approximation register analog-to-digital converter (SAR ADCs), each of the SAR ADCs comprising a digital-to-analog converter (DAC), a comparator, and a metastability detector:
   sampling a received analog electrical signal using the DAC controlled by sampling clock pulses;
   converting the received analog electrical signal to an n-bit digital signal by evaluating bits using the comparator in each of the SAR ADCs, wherein if the metastability detector determines that a time to evaluate one of the bits is longer than a threshold time, the metastability detector generates a metastability flag for each such bit; and
   storing metastability flags in a first SR latch register in the metastability detector.

\* \* \* \* \*

UNITED STATES PATENT AND TRADEMARK OFFICE
CERTIFICATE OF CORRECTION

PATENT NO. : 11,025,265 B2
APPLICATION NO. : 16/738880
DATED : June 1, 2021
INVENTOR(S) : Oleksiy Zabroda Page 1 of 1

It is certified that error appears in the above-identified patent and that said Letters Patent is hereby corrected as shown below:

In the Claims

In Column 13, Line 34, in Claim 16, delete "claim 14," and insert -- claim 15, --, therefor.

Signed and Sealed this
Twenty-seventh Day of July, 2021

Drew Hirshfeld
*Performing the Functions and Duties of the*
*Under Secretary of Commerce for Intellectual Property and*
*Director of the United States Patent and Trademark Office*